United States Patent
Lee et al.

(10) Patent No.: US 7,663,236 B2
(45) Date of Patent: Feb. 16, 2010

(54) SEMICONDUCTOR ELECTRODE CONTAINING PHOSPHATE AND SOLAR CELL USING THE SAME

(75) Inventors: Eun Sung Lee, Seoul (KR); Young Jun Park, Suwon-si (KR); Sang Cheol Park, Seoul (KR); Jung Gyu Nam, Yongin-si (KR); Ju Chul Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 473 days.

(21) Appl. No.: 11/539,448

(22) Filed: Oct. 6, 2006

(65) Prior Publication Data

US 2007/0269923 A1 Nov. 22, 2007

(30) Foreign Application Priority Data

May 18, 2006 (KR) .................. 10-2006-0044623

(51) Int. Cl.
 *H01L 31/0224* (2006.01)
(52) U.S. Cl. ............... 257/749; 257/750; 257/E31.126; 438/85; 438/104; 136/256
(58) Field of Classification Search ............ 438/85, 438/104; 136/256; 257/749, 750, E31.124, 257/E31.126
 See application file for complete search history.

(56) References Cited

U.S. PATENT DOCUMENTS

| | | | |
|---|---|---|---|
| 4,636,257 A * | 1/1987 | Baudry et al. ............ 106/31.95 |
| 4,751,206 A * | 6/1988 | Yamai et al. ............... 501/102 |
| 5,464,990 A * | 11/1995 | Shiratsuki et al. ............ 257/40 |
| 5,672,558 A * | 9/1997 | White et al. ................ 502/349 |
| 6,306,747 B1 * | 10/2001 | Andriessen et al. ......... 438/609 |
| 6,387,517 B1 * | 5/2002 | Belleville et al. ........... 428/447 |
| 6,885,276 B2 * | 4/2005 | Iha et al. .................... 336/200 |
| 7,410,825 B2 * | 8/2008 | Majumdar et al. .......... 438/106 |
| 2004/0103936 A1 * | 6/2004 | Andriessen ................. 136/252 |
| 2005/0069648 A1 * | 3/2005 | Maruyama .................. 427/379 |
| 2007/0102676 A1 * | 5/2007 | Lee et al. .................... 252/500 |
| 2007/0151601 A1 * | 7/2007 | Jung et al. .................. 136/263 |
| 2007/0199477 A1 * | 8/2007 | Hill et al. ............... 106/287.13 |
| 2008/0004380 A1 * | 1/2008 | Bak et al. ................... 524/160 |

OTHER PUBLICATIONS

B.O' Regan, M. Gratzel, Nature, 1991, vol. 353, p. 737-740.

* cited by examiner

Primary Examiner—M. Wilczewski
(74) Attorney, Agent, or Firm—Cantor Colburn LLP (57) ABSTRACT

Disclosed herein is a semiconductor electrode with improved power conversion efficiency through inhibition of recombination reactions of electrons. The semiconductor electrode comprises a transparent electrode consisting of a substrate and a conductive material coated on the substrate, and a metal oxide layer formed on the transparent electrode wherein the metal oxide layer contains a phosphate.

Further disclosed is a solar cell employing the semiconductor electrode.

14 Claims, 4 Drawing Sheets

SEMICONDUCTOR ELECTRODE CONTAINING PHOSPHATE AND SOLAR CELL USING THE SAME

This non-provisional application claims priority to Korean Patent Application No. 10-2006-0044623, filed on May 18, 2006, and all the benefits accruing under 35 U.S.C. § 119(a), the disclosure of which is herein incorporated by reference in its entirety.

BACKGROUND OF THE INVENTION

1. Field of the Invention

The present invention relates to a semiconductor electrode containing a phosphate and a solar cell employing the semiconductor electrode. More particularly, the present invention relates to a semiconductor electrode with improved power conversion efficiency through inhibition of recombination reactions of electrons, and a solar cell employing the semiconductor electrode.

2. Description of the Related Art

In recent years, numerous studies have focused on various alternative energy sources for conventional fossil fuels to solve urgent energy consumption problems. In particular, extensive research into effective utilization of natural energy resources, including wind power, atomic energy and solar energy, has been conducted to replace petroleum resources that may be used up within the next several decades. Solar cells take advantage of inexhaustible solar energy, unlike other energy sources, and are environmentally friendly. Since the first selenium (Se) solar cell was developed in 1983, silicon (Si) solar cells have drawn a great deal of attention and interest.

However, since silicon solar cells can incur considerable fabrication costs, there are some limitations in the practical application and improvement in the efficiency of the cells. To overcome these limitations, the development of dye-sensitized polar cells that can be fabricated at reduced costs is actively under consideration.

Unlike silicon solar cells, dye-sensitized solar cells are photoelectrochemical solar cells that consist essentially of photosensitive dye molecules capable of absorbing visible rays to form electron-hole pairs and a transition metal oxide for transferring the generated electrons. Various dye-sensitized solar cells have been developed. Of these, a representative dye-sensitized solar cell was reported by Gratzel et al. in Switzerland in 1991 (B. O'Regan, M. Gratzel, *Nature* 1991, vol. 353, p. 737). The solar cell developed by Gratzel et al. comprises a semiconductor electrode composed of titanium dioxide nanoparticles covered with dye molecules, a counter electrode (e.g., a platinum electrode), and an electrolyte filled between the electrodes. Such solar cells, which can be fabricated at low costs per electric power generated when compared to conventional silicon cells, are desirable as replacements for conventional solar cells.

Figure 1:
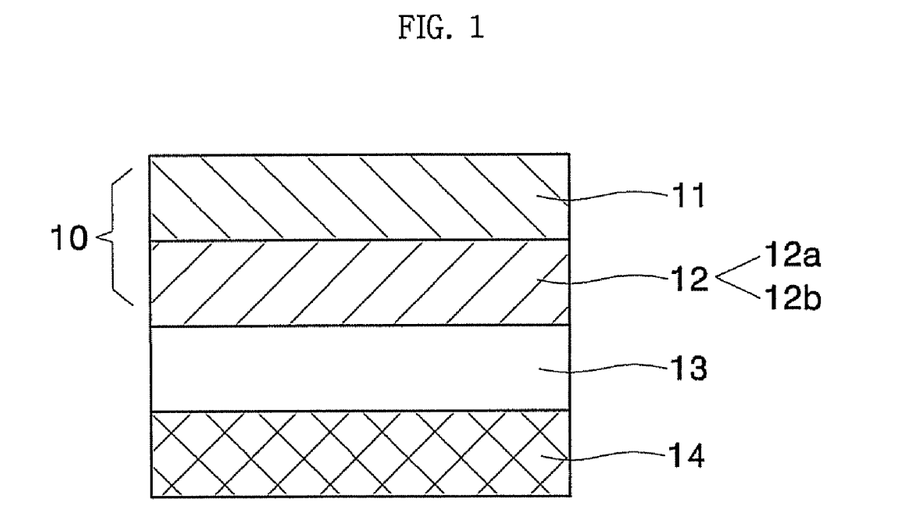
FIG. 1 is a view schematically showing the structure of an exemplary conventional dye-sensitized solar cell of the prior art.

The structure of a conventional dye-sensitized solar cell is shown in FIG. 1. Referring to FIG. 1, the dye-sensitized solar cell comprises a semiconductor electrode 10, a counter electrode 14, and an electrolyte layer 13 disposed between the semiconductor electrode 10 and the counter electrode 14, wherein the semiconductor electrode includes a transparent conductive electrode 11 and a light-absorbing layer 12 disposed between the transparent conductive electrode 11 and the electrolyte layer 13.

The light-absorbing layer 12 generally contains a metal oxide 12a and a dye 12b. The dye 12b may be in a neutral state (S), a transition state (S*) or an ionic state (S+). When sunlight is incident on the dye, the dye molecules undergo electronic transitions from the ground state (S/S+) to the excited state (S*/S+) to form electron-hole pairs, and the electrons (e−) in an excited state are injected into a conduction band (CB) of the metal oxide 12a to generate an electromotive force.

However, since the electrons (e−) in an excited state are injected from the dye molecules into the conduction band of the metal oxide 12a at a much higher speed than the electrons can migrate from the conduction band to the transparent conductive electrode 11, some of the electrons accumulate on the surface and the inside of the conduction band, where they recombine with the dye molecules or cause recombination reactions, e.g., bonding with redox couples present within the electrolyte, resulting in a decrease in power conversion efficiency. This decrease results in reduction of electromotive power. In particular, when the metal oxide layer is formed of nanoparticles, aggregation of the nanoparticles takes place, and interfaces formed between the nanoparticles act as resistors, resulting in a further decrease in electrical conductivity and power conversion efficiency.

Thus, inhibition of such accumulation and recombination reactions of electrons is considered significant in improving the electrical conductivity of electrodes to increase the power conversion efficiency of solar cells.

BRIEF SUMMARY OF THE INVENTION

Therefore, to alleviate the above deficiencies, a semiconductor electrode with inhibited recombination reactions of electrons and improved power conversion efficiency is provided.

In an embodiment, a solar cell comprising the semiconductor electrode is also provided.

In an embodiment, a semiconductor electrode comprising a transparent electrode consisting of a substrate and a conductive material coated on the substrate, and a metal oxide layer formed on the transparent electrode wherein the metal oxide layer contains a phosphate.

In an embodiment, the phosphate may be in a $PO_2$ or $PO_3$ form.

In a further embodiment, the metal oxide layer may be formed using a paste composition comprising a metal oxide, a solution of a binder in a solvent and a phosphate group-containing compound.

In a further embodiment, the phosphate group-containing compound may be at least one compound selected from the group consisting of phosphoric acid, sodium hexametaphosphate, sodium tripolyphosphate, tetrasodium pyrophosphate, trisodium phosphate, disodium phosphate, ammonium phosphates, and compounds of the following Formulae 1 to 3:

(1)

wherein R is $C_1$-$C_{30}$ linear or branched alkyl, and
k is an integer from 1 to 20;

(2)

wherein X is an oxyethyl methacryloyl, oxyethyl acryloyl, polyoxypropyl methacryloyl, or polyoxyethyl methacryloyl group, and l is an integer from 1 to 20; and (3)

wherein $R_1$, $R_2$ and $R_3$ are independently OH, ONa or $C_1$-$C_{30}$ linear or branched alkyl, provided that at least one of $R_1$, $R_2$ and $R_3$ is $C_1$-$C_{30}$ linear or branched alkyl.

In a further embodiment, the metal oxide may be at least one oxide selected from the group consisting of titanium oxide, niobium oxide, hafnium oxide, indium oxide, tungsten oxide, tin oxide, and zinc oxide.

In a further embodiment, the metal oxide is a nanomaterial composed of quantum dots, nanodots, nanotubes, nanowires, nanobelts, or nanoparticles.

In a further embodiment, the solvent may be selected from the group consisting of aqueous solvents, organic solvents, and mixtures thereof.

In a further embodiment, the binder may be selected from the group consisting of aqueous binders, organic binders, and mixtures thereof.

In a further embodiment, the paste composition comprises 10 to 40% by weight of the metal oxide, 1 to 10% by weight of the phosphate group-containing compound with respect to the weight of the metal oxide powder, and the balance of the binder solution.

In a still further embodiment, the semiconductor electrode may further comprise a dye bonded to the metal oxide exposed on the surface of the semiconductor electrode.

In another embodiment, there is provided a solar cell comprising the semiconductor electrode, an electrolyte layer, and a counter electrode.

In another embodiment, a method of making a semiconductor electrode is provided, comprising forming a metal oxide layer on a surface of a transparent electrode consisting essentially of a substrate and a conductive material coated on the substrate.

In a further embodiment, forming the semiconductor electrode is performed by contacting the above-described paste composition with the transparent electrode, and baking the paste composition.

BRIEF DESCRIPTION OF THE DRAWINGS

The above and other objects, features and other advantages will be more clearly understood from the following detailed description taken in conjunction with the accompanying drawings, in which.

DETAILED DESCRIPTION OF THE INVENTION

The present invention will now be described in greater detail.

It will be understood in the following disclosure of the present invention, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (i.e., in at least partial contact with) the other element(s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor electrode of the present invention comprises a transparent electrode consisting essentially of a sub- strate and a conductive material coated on the substrate, and a metal oxide layer formed on the transparent electrode wherein the metal oxide layer contains a phosphate.

When a metal oxide layer is formed using metal oxide nanoparticles, interfaces between the nanoparticles function as resistors so that electrons (e⁻) are accumulated on the surface and the inside of a conduction band of the metal oxide layer, and the accumulated electrons can recombine with dye molecules or cause recombination reactions, e.g., bonding with redox couples present within an electrolyte, resulting in a reduction in electrical conductivity. In contrast, a phosphate is introduced into the metal oxide layer of the semiconductor electrode according to the present invention, and the accumulation and recombination reactions involving electrons are inhibited. That is, the phosphate group adsorbed on the surface of nanoparticles that constitute the metal oxide layer reduces particle-particle interactions between the nanoparticles and traps electrons accumulated on the surface of the metal oxide layer to prevent bonding of the electrons with dye molecules or redox couples present within the electrolyte. As a result, electrons injected from the outside of the semiconductor electrode into the metal oxide layer readily migrate from the inside of the metal oxide layer to the transparent conductive electrode, thus achieving an improvement in electrical conductivity and power conversion efficiency.

The phosphate introduced into the metal oxide layer of the semiconductor electrode can exist in any possible form, and non-limiting specific examples thereof include $PO_2$ and $PO_3$ forms.

The metal oxide layer, which contains a phosphate, of the semiconductor electrode may be formed using a composition comprising a metal oxide, a solution of a binder in a solvent, and a phosphate group-containing compound.

The phosphate group-containing compound has a phosphate group in the molecular structure. The phosphate group-containing compound is not particularly limited so long as a phosphate group of the compound may be contacted to the surface of the metal oxide nanoparticles after baking. In an embodiment, the phosphate group-containing compound, can be at least one compound selected from phosphoric acid, sodium hexametaphosphate, sodium tripolyphosphate, tetrasodium pyrophosphate, trisodium phosphate, disodium phosphate, ammonium phosphates, and compounds of the following Formulae 1 to 3:

(1)

wherein R is $C_1$-$C_{30}$ linear or branched alkyl, and k is an integer from 1 to 20;

(2)

wherein X is an oxyethyl methacryloyl, oxyethyl acryloyl, polyoxypropyl methacryloyl or polyoxyethyl methacryloyl group, and l is an integer from 1 to 20; and (3)

wherein $R_1$, $R_2$ and $R_3$ are independently OH, ONa or $C_1$-$C_{30}$ linear or branched alkyl, provided that at least one of $R_1$, $R_2$ and $R_3$ is $C_1$-$C_{30}$ linear or branched alkyl.

In a specific embodiment, at least compound selected from the compounds of Formulae 1 to 3 can be used. These compounds play a role in the formation of a phosphate group on the surface of the metal oxide nanoparticles after baking as well as function as dispersants. The compound of Formula 1 is a phosphate ester type dispersant with a tail structure comprising a hydrophilic block and a hydrophobic block. The compound of Formula 2 is a phosphate ester type dispersant having an acrylic backbone. The compound of Formula 3 is a phosphate type dispersant having an alkyl chain. These compounds serve to further improve the dispersibility of the metal oxide paste composition, thus increasing in the density of the metal oxide layer. In addition, the use of the compounds enables adsorption of a larger amount of dyes, thus contributing to an improvement in the power conversion efficiency of solar cells. Furthermore, the need for an additional coating process to improve the dispersibility of the metal oxide paste composition is avoided, thus resulting in increased efficiency in terms of processing and production costs.

In an exemplary embodiment, useful compounds of Formulae 1 to 3 are represented by the following Formulae 4 to 7:

(4)

wherein m is an integer from 1 to 20;

(5)

wherein n is an integer from 1 to 20;

(6)

and

-continued

(7)

In a further exemplary embodiment, useful compounds of Formulae 4 and 5 are represented by the following Formulae 8 through 11:

(8)

(9)

(10)

and (11)

Further, the metal oxide used in the paste composition can include at least one oxide selected from the group consisting of titanium oxide, niobium oxide, hafnium oxide, indium oxide, tungsten oxide, tin oxide, and zinc oxide, without any particular limitation. These metal oxides may be used alone or in combination thereof. Exemplary metal oxides include $TiO_2$, $SnO_2$, $ZnO$, $WO_3$, $Nb_2O_5$, and $TiSrO_3$. In a specific exemplary embodiment, anatase $TiO_2$ can be used.

The metal oxide desirably has a nanostructure selected from quantum dots, nanodots, nanotubes, nanowires, nanobelts, and nanoparticles. This nanostructure of the metal oxide is advantageous in that a dye adsorbed on the surface of the metal oxide absorbs a larger amount of light and the degree of adsorption to an electrolyte layer is improved due to increased surface area.

The particle diameter of the metal oxide is not especially limited, and can be between 1 nm and 1,000 nm, and more specifically between 5 nm and 400 nm. If desired, two or more kinds of the metal oxides having different particle sizes may be mixed to scatter incident light and improve the quantum yield.

Taking into consideration the type of the metal oxide and the binder and the desired physical properties of the metal oxide paste composition, at least one solvent selected from the group consisting of commercially available solvents, for example, aqueous solvents, organic solvents, and mixtures thereof, can be used as the solvent of the binder solution. Specifically, the solvent may be selected from: aromatic hydrocarbon compounds, such as for example toluene and xylene; ether compounds, such as for example tetrahydrofuran and 1,2-butoxyethane; ketone compounds, such as for example acetone and methyl ethyl ketone; ester compounds, such as for example ethyl acetate, butyl acetate, butyl carbitol acetate ("BCA"), and propylene glycol monomethyl ether acetate; alcohol compounds, such as for example isopropyl alcohol, diethylene glycol monobutyl ether, terpineol and 2-phenoxyethanol; water; and mixtures of the foregoing solvent, but is not limited thereto. In an exemplary embodiment, water, or a mixed solvent of terpineol and butyl carbitol acetate may be used.

The binder contained in the binder solution plays a role in making the binder solution viscous after being dissolved in the solvent and imparting a binding force after the metal oxide paste composition is dried. As in the selection of the solvent, taking into consideration the type of the metal oxide and the desired physical properties of the metal oxide paste composition, the binder may be selected from commercially available binders and mixtures thereof. The binder may be selected from the group consisting of, but not limited to, aqueous binders, organic binders and mixtures thereof. More specifically, the binder may be at least one binder selected from the group consisting of acrylic, styrenic, cellulosic and methacrylate polymers, styrene-acrylate copolymers, polystyrene, polyvinyl butyral, polyvinyl alcohol, polyethylene oxide, polypropylene carbonate, polymethylmethacrylate, ammonium acrylate, gum arabic, and gelatin.

The mixing ratio of the binder to the solvent is not particularly limited, and can be appropriately determined depending on the desired application and need by those skilled in the art. The mixing ratio of the binder to the solvent may be 3:3 to 3:15 and more specifically 3:3 to 3:10.

The paste composition may further comprise at least one additive selected from plasticizers, leveling agents, antioxidants, lubricants, antifoamers, and the like, so long as the physical properties of the paste composition are not imparted.

The components and component amounts for the paste composition may be appropriately varied depending on the desired application and need by those skilled in the art. In an embodiment, the paste composition comprises 10 to 40% by weight of the metal oxide, 1 to 10% by weight of the phosphate group-containing compound with respect to the weight of the metal oxide powder, and the balance of the binder solution.

Processes for the formation of the metal oxide layer using the metal oxide paste composition are not especially limited. Taking the desired physical properties, ease of formation and formation costs into consideration, the formation of the metal oxide layer is desirably achieved by a wet process. That is, the paste composition can be coated on a transparent electrode consisting of a substrate and a conductive material coated on the substrate. Spraying, spin coating, dipping, printing, doctor blading, sputtering, and electrophoresis may also be employed without any limitation for the coating of the paste composition. The coated structure is subsequently subject to drying and baking. The drying may be performed at about 50° C. to about 100° C., and the baking may be performed at about 400° C. to about 600° C.

The metal oxide layer must be able to transmit light incident through the transparent conductive film. In addition, since the metal oxide layer must be sufficiently adsorbed to a dye and an electrolyte layer, it is required to have a proper thickness, specifically about 1 to about 30 µm. In addition, the metal oxide layer may also be formed into a bilayer using two kinds of metal oxides having different particle sizes.

The transparent electrode of the semiconductor electrode is produced by coating a conductive material on a substrate. The substrate may be of any type so long as it is transparent, and specific examples thereof include transparent inorganic substrates, such as quartz and glass substrates, and transparent plastic substrates, such as polyethylene terephthalate ("PET"), polyethylene naphthalate ("PEN"), polycarbonate, polystyrene and polypropylene substrates.

Examples of suitable conductive materials that can be coated on the substrate include, but are not limited to, indium tin oxide ("ITO"), fluorine-doped tin oxide ("FTO"), ZnO—Ga$_2$O$_3$, ZnO—Al$_2$O$_3$, SnO$_2$—Sb$_2$O$_3$, and conductive polymers, e.g., PEDTP.

The semiconductor electrode may further comprise a dye formed on top of the metal oxide layer. The dye particles are adsorbed on the surface of the metal oxide layer. The dye particles absorb light and undergo electronic transitions from the ground state (S/S$^+$) to the excited state (S*/S$^+$) to form electron-hole pairs. The excited electrons (e$^-$) are injected into a conduction band ("CB") of the metal oxide and transferred to the electrode to generate an electromotive force.

Any dye material that can be generally used in the field of solar cells may be used without any limitation. Ruthenium complexes may preferably be used as the dye. In addition to ruthenium complexes, any colorant may be used without particular limitation if it has charge separation functions and exhibits sensitizing functions. As suitable colorants, there can be mentioned, for example: xanthene type colorants, such as Rhodamine B, Rose Bengal, eosin and erythrosine; cyanine type colorants, such as quinocyanine and cryptocyanine; basic dyes, phenosafranine, Capri blue, thiosine, and Methylene Blue; porphyrin type compounds, such as chlorophyll, zinc porphyrin, and magnesium porphyrin; azo colorants; complex compounds, such as phthalocyanine compounds and Ru trisbipyridyl; anthraquinone type colorants; polycyclic quinine type colorants; and the like. These colorants may be used alone or in combination of two or more of the colorants. As the ruthenium complexes, there can be used RuL$_2$(SCN)$_2$, RuL$_2$(H$_2$O)$_2$, RuL$_3$, and RuL$_2$ (wherein L is 2,2'-bipyridyl-4,4'-dicarboxylate, and the like.).

The semiconductor electrode inhibits recombination reactions of electrons and facilitates migration of electrons to the electrode due to the activity of the phosphate contained in the metal oxide layer. Accordingly, when the semiconductor electrode is used in the fabrication of dye-sensitized solar cells, an improvement in the power conversion efficiency of the solar cells is achieved. The present invention provides a dye-sensitized solar cell comprising the semiconductor electrode, an electrolyte layer, and a counter electrode.

The electrolyte layer is composed of an electrolytic solution, for example, a solution of iodine in acetonitrile, an N-methyl-2-pyrrolidone ("NMP") solution, or a 3-methoxypropionitrile solution. Any electrolytic solution may be used, without limitation, so long as it exhibits hole conductivity.

The counter electrode can be made of, without any limitation, an electrically conductive material. So long as a conductive layer is disposed on the surface of the counter electrode facing the semiconductor electrode, any insulating material may be used to form the counter electrode. It is desirable to use an electrochemically stable material to form the counter electrode. Exemplary electrochemically stable materials include platinum, gold, and carbon. For the purpose of improving the catalytic effects of oxidation and reduction, it is also desirable that the surface of the counter electrode facing the semiconductor electrode have a microstructure with increased surface area. For example, useful materials for the counter electrode are platinum black and porous carbon. The platinum black counter electrode can be produced by anodic oxidation of platinum, treatment with hexachloroplatinate, and the like. The porous carbon counter electrode can be produced by sintering of fine carbon particles or by baking of an organic polymer.

The dye-sensitized solar cell can be fabricated by a known method.

Hereinafter, the present invention will be explained in more detail with reference to the following examples and comparative examples. However, these examples do not serve to limit the invention.

EXAMPLES

Synthesis Example 1

(10)

Figure 2:
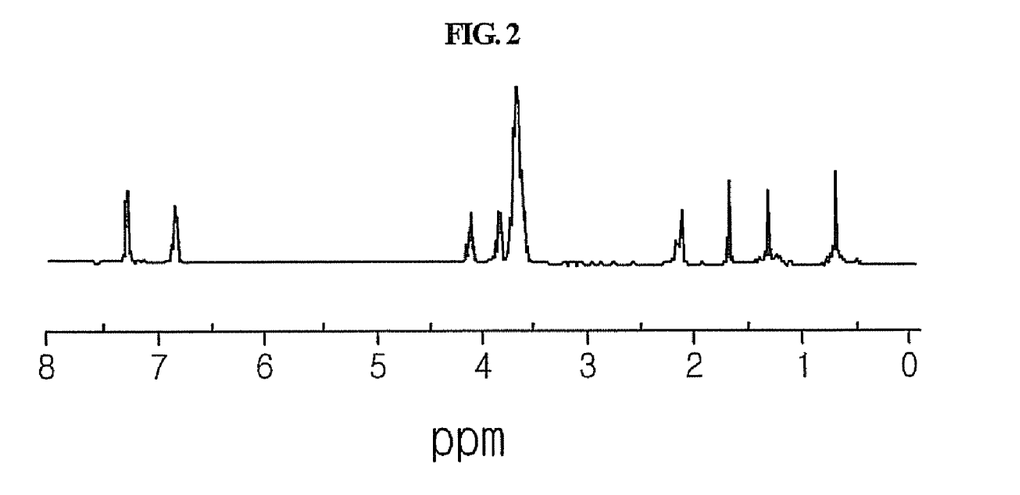
FIG. 2 is a $^1$H-NMR spectrum of an exemplary phosphate group-containing compound prepared in Synthesis Example 1.

The compound of Formula 10 was synthesized by the following Reaction Scheme 1:

Sodium hydride (50 mmol) was slowly added to a solution of TX-45™ (25 mmol, Sigma-Aldrich® Co., USA) in dry THF (50 mmol) at 25° C. The mixture was stirred for 2 hours. After dimethyl chlorophosphate (50 mmol) was added dropwise at 0° C. over 2 hours, the mixture was stirred under a stream of nitrogen gas at 25° C. for 12 hours. Subsequently, the reaction mixture was poured into ice water, followed by phase separation. The organic layer was separated and washed with an aqueous HCl solution and water. The product was added to a mixture of an aqueous 3M NaOH solution (100 ml) and methanol (10 ml). The resulting solution was refluxed for 12 hours. The reaction mixture was acidified to pH 2 using an aqueous HCl solution. Methylene chloride was added to provide phase separation. The organic layer so obtained was evaporated under reduced pressure to remove the solvents, giving the phosphate ester of Formula 10 (yield:

84%) as a yellow viscous oil. FIG. 2 shows 500 MHz $^1$H-NMR spectrum of the compound.

Example 1

A metal oxide paste composition was prepared as follows: In this example, commercially available titanium dioxide (nc-$TiO_2$) (P25, Degussa®, 80% anatase, 20% rutile) was used as a metal oxide. The titanium dioxide powder was dried under vacuum at 130° C. for 24 hours to remove moisture and volatile organic substances contained therein before use. A mixed solvent of 70% (v/v) α-terpineol (Kanto Chemical Co., Japan) and 30% (v/v) butyl carbitol acetate (Kanto Chemical Co., Japan) was used as a solvent, and ethylcellulose (ETHO-CEL®, standard 45, Dow Chemical Corp., USA) was used as a binder. The ethylcellulose was mixed with the mixed solvent of α-terpineol and butyl carbitol acetate in a silicone bath at 50° C. to prepare a binder solution. The binder and the solvent were mixed in a weight ratio of 3:5, respectively. To the binder solution was added $TiO_2$ nanoparticles in an amount of 26 wt %, based on the total weight of solvent, binder, and nanoparticles, and thereafter, the compound of Formula 10 as prepared in Synthesis Example 1 was added thereto in an amount of 6 wt %, based on the weight of the $TiO_2$ nanoparticles. The mixture was mixed using a milling machine using yttria-stabilized zirconia balls to obtain the metal oxide paste composition.

Fluorine-doped tin oxide (FTO) was applied to a glass substrate using a sputter to form a transparent electrode having a thickness of 1 µm. Subsequently, the nc-$TiO_2$ particle paste prepared above was applied to the transparent electrode by screen-printing, and dried at 70° C. for 30 minutes. After completion of the drying, the resulting structure was placed in an electric furnace, heated at a rate of 3° C./min to 450° C. in air, maintained at 450° C. for 30 minutes, and cooled at the same rate as the heating rate to produce a porous $TiO_2$ film having a final thickness of 17 µm. Thereafter, the glass substrate on which the metal oxide layer was formed was dipped in a solution (0.3 mM) of an N719 dye in ethanol, and dried to adsorb the dye on the surface of the $TiO_2$ layer, completing production of a semiconductor electrode.

Example 2

Platinum was coated by sputtering to a thickness of 1 µm on the surface of an ITO-coated transparent conductive glass substrate to form a counter electrode. The counter electrode and the semiconductor electrode produced in Example 1 were arranged in such a manner that the conducting surfaces of the two electrodes faced to each other. Subsequently, a spacer film (SURLYN®, available DuPont) having a thickness of 100 µm was interposed between the two electrodes, and the two electrodes were adhered to each other under a pressure of about 0.2 Megapascals (MPa) on a hot plate at about 120° C. An electrolytic solution was filled in a space formed between the two electrodes to complete fabrication of a dye-sensitized solar cell. At this time, as the electrolytic solution, an $I_3^-/I^-$ electrolytic solution of 0.6 moles of 1,2-dimethyl-3-octyl-imidazolium iodide, 0.2 moles of LiI, 0.04 moles of $I_2$ and 0.2 moles of 4-tert-butyl-pyridine ("TBP") in acetonitrile was used.

Examples 3 to 7

Semiconductor electrodes were produced in the same manner as in Example 1, except that the compounds of Formula 6 (Example 3), Formula 7 (Example 4), Formula 8 (Example 5), Formula 11 (Example 6) and sodium hexametaphosphate (Example 7) were used as phosphate group-containing compounds instead of the compound of Formula 10 to prepare respective nc-$TiO_2$ particle pastes.

Examples 8 to 12

Solar cells were fabricated in the same manner as in Example 2, except that the semiconductor electrodes produced in Examples 3 to 7 were used, respectively.

Comparative Example 1

A semiconductor electrode was produced in the same manner as in Example 1, except that an nc-$TiO_2$ particle paste was prepared without the addition of the compound of Formula 10.

Comparative Example 2

A solar cell was fabricated in the same manner as in Example 2, except that the semiconductor electrode produced in Comparative Example 1 was used.

Experimental Example 1

Figure 3:
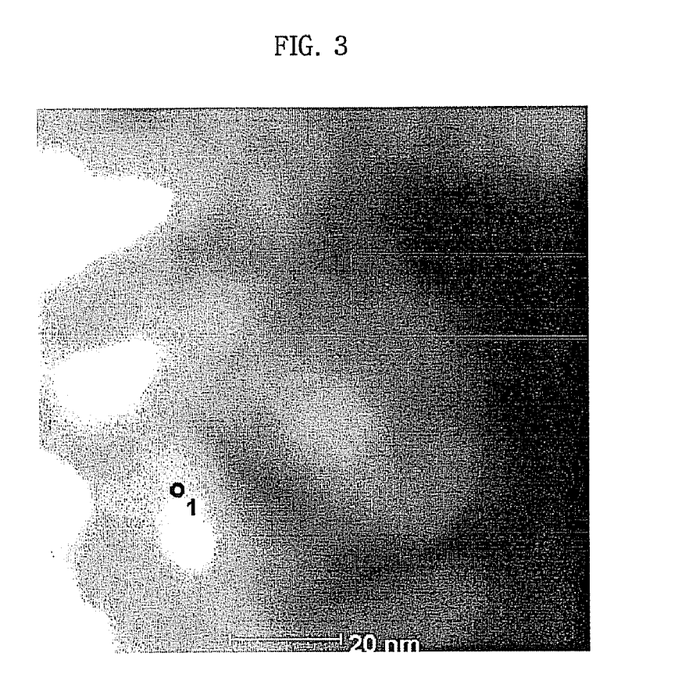
FIG. 3 is a transmission electron microscopy ("TEM") image showing a $TiO_2$ surface of an exemplary semiconductor electrode produced in Example 1.
Figure 4:
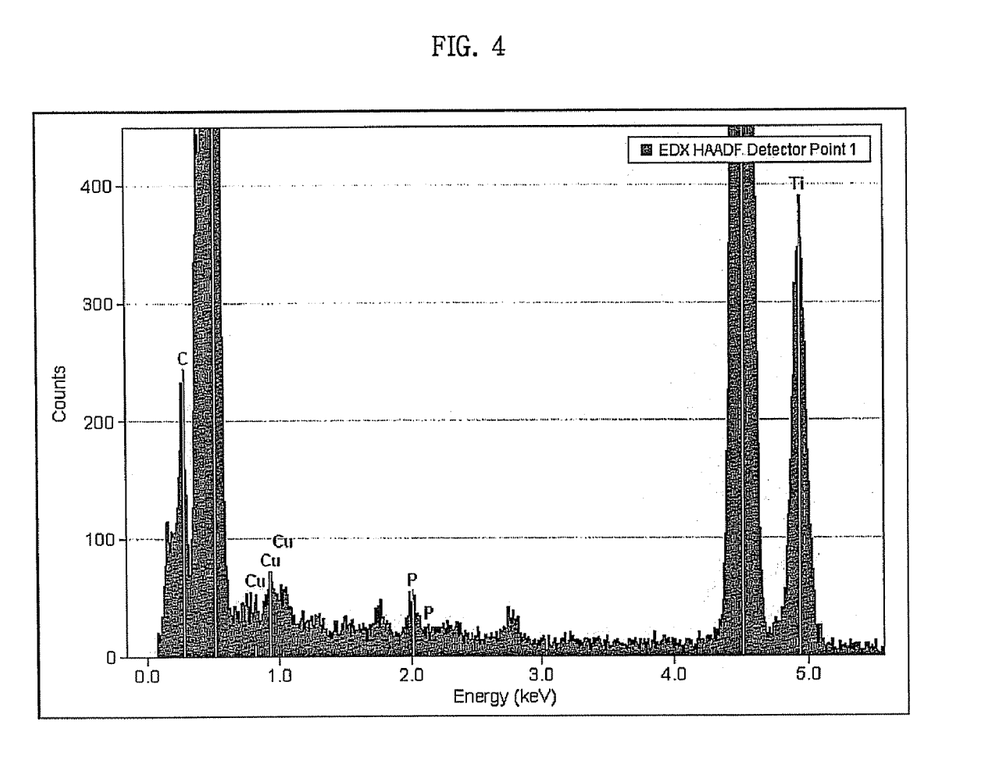
FIG. 4 is a graph showing the analytical results of energy dispersive spectroscopy ("EDS") using transmission electron microscopy (TEM) for a $TiO_2$ surface of an exemplary semiconductor electrode produced in Example 1.

Transmission electron microscopy imaging and energy dispersive spectroscopy ("EDS") (TECNAI-G2, FEI) were conducted to determine whether or not the phosphate was present on the $TiO_2$ surface of the semiconductor electrode produced in Example 1, and the analytical results are shown in FIGS. 3 and 4, respectively.

Referring first to FIG. 3, '°1' represents the phosphate introduced on the $TiO_2$ surface. Turning now to FIG. 4, peaks corresponding to phosphorous (P) atoms were observed. These observations show that the phosphate was introduced on the $TiO_2$ surface of the semiconductor electrode.

Experimental Example 2

Figure 5:
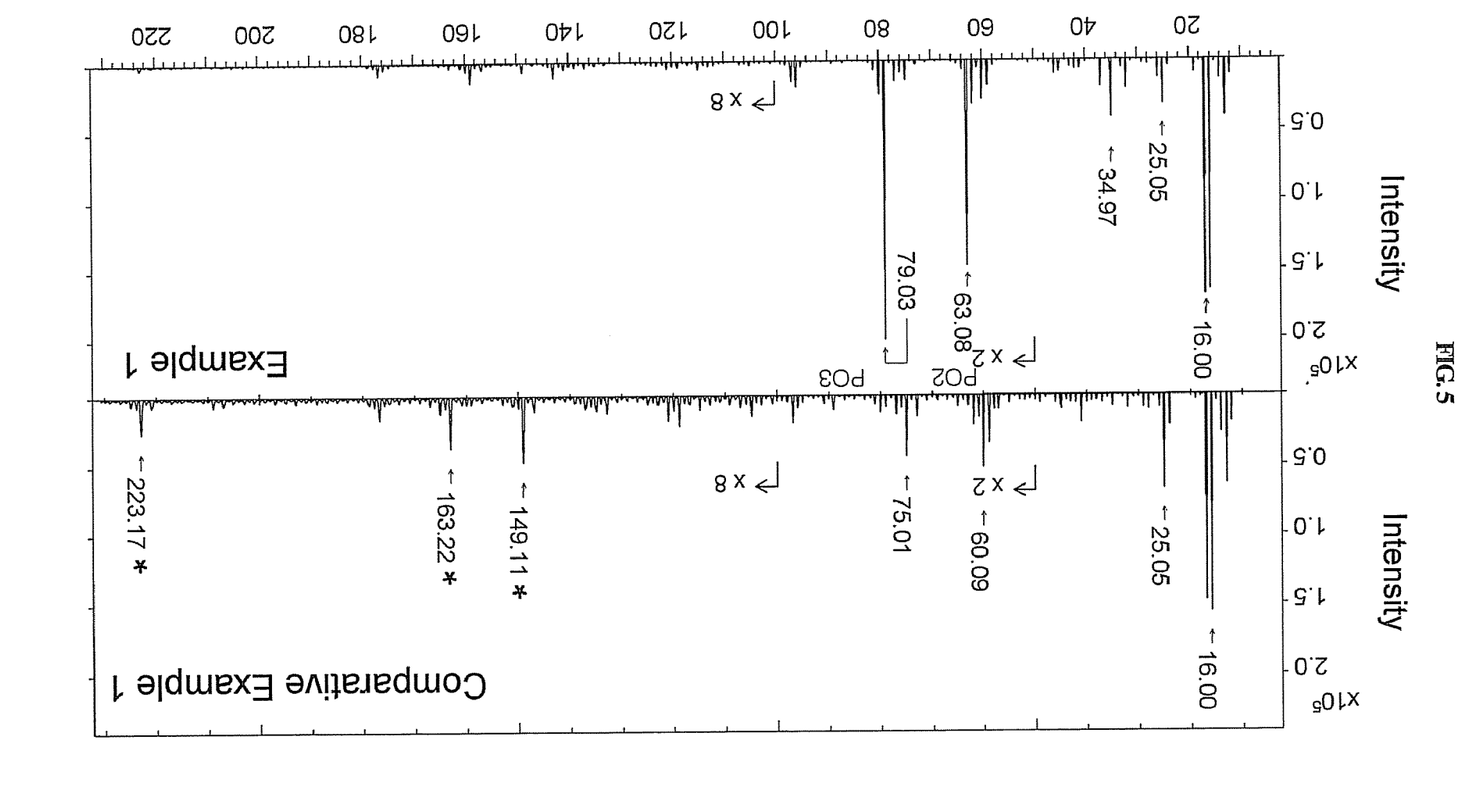
FIG. 5 shows the analytical results of TOF-SIMMS for $TiO_2$ surfaces of exemplary semiconductor electrodes produced in Example 1 and Comparative Example 1.

To confirm whether or not the phosphate was present on the $TiO_2$ surfaces of the semiconductor electrodes produced in Example 1 and Comparative Example 1, components and their contents of the $TiO_2$ surfaces were analyzed by TOF-SIMMS (IV, ION-TOF). The results are shown in FIG. 5. FIG. 5 shows negative mass spectra of the $TiO_2$ surfaces. From the spectra shown in FIG. 5, it could be confirmed that peaks corresponding to $PO_2$ and $PO_3$, which are characteristic peaks of the phosphate, were observed in the semiconductor electrode produced in Example 1, whereas no peak corresponding to $PO_2$ and $PO_3$ was observed in the semiconductor electrode produced in Comparative Example 1.

Experimental Example 3

To measure the power conversion efficiency of the solar cells fabricated in Example 2 and Comparative Example 2, the photovoltages and photocurrents of the solar cells were measured. For the measurements, a xenon lamp (01193, Oriel) was used as a light source, and a standard solar cell (Frunhofer Institute Solar Engeriessysteme, Certificate No. C-ISE369, Type of material: Mono-Si$^+$ KG filter) was used to compensate for the solar conditions (AM 1.5) of the xenon lamp. The photocurrent density ($I_{sc}$), open-circuit voltage ($V_{oc}$) and fill factor (FF) of the solar cells were calculated from the obtained photocurrent-photovoltage curves, and the power conversion efficiency ($\eta_e$) of the solar cells was calculated according to the following equation:

$$\eta_e(\%) = (V_{oc} \cdot I_{sc} \cdot FF)/(P_{inc}) \times 100$$

where $P_{inc}$ is 100 mw/cm$^2$ (1 sun).

The results obtained are shown in Table 1.

TABLE 1

| Example No. | Thickness (μm) | $J_{sc}$ (mA/cm$^2$) | $V_{oc}$ (mV) | FF | Power conversion efficiency (%) |
|---|---|---|---|---|---|
| Example 2 | 18.357 | 10.120 | 690.375 | 0.716 | 5.025 |
| Comparative Example 2 | 16.559 | 9.333 | 637.220 | 0.762 | 4.548 |

As can be seen from the results of Table 1, the solar cell, which comprises a semiconductor electrode in which a phosphate is introduced, showed increased photocurrent density ($I_{sc}$) and photocurrent (Voc), resulting in an improvement in power conversion efficiency.

Figure 6:
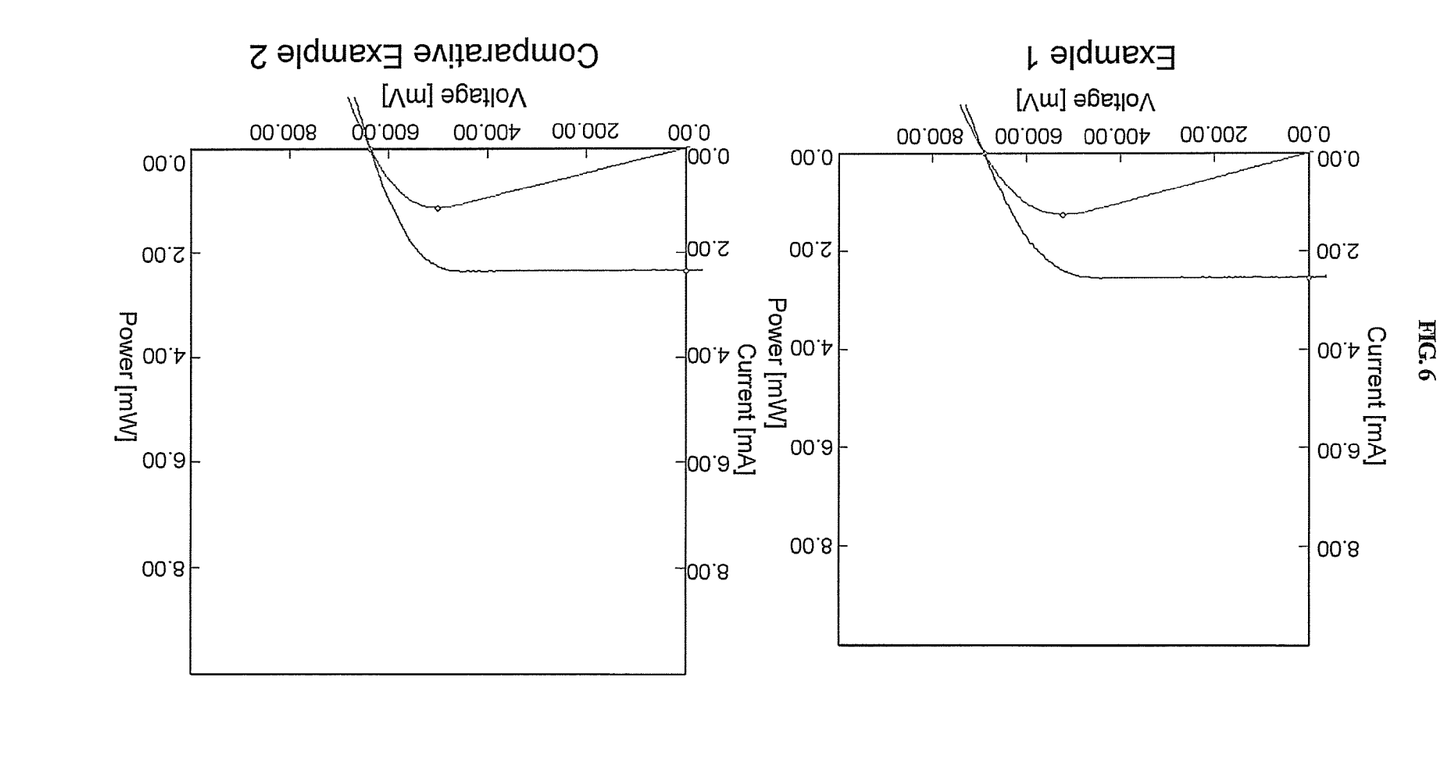
FIG. 6 shows plots of photocurrent versus photovoltage of exemplary solar cells fabricated in Example 2 and Comparative Example 2.

FIG. 6 shows plots of photocurrent versus photovoltage of the solar cells fabricated in Example 2 and Comparative Example 2. The graphs of FIG. 6 demonstrate that the solar cell fabricated in Example 2, which comprises a semiconductor electrode containing a phosphate, showed higher current and voltage values than the solar cell fabricated in Comparative Example 2, which comprises a semiconductor electrode containing no phosphate. In conclusion, improved voltage-current characteristics of the solar cell according to the present invention, which uses a semiconductor electrode containing a phosphate, lead to an improvement in power conversion efficiency.

Although the preferred embodiments have been disclosed for illustrative purposes, those skilled in the art will appreciate that various modifications and variations are possible, without departing from the technical spirit of the invention. Accordingly, such modifications and variations are intended to come within the scope of the appended claims.

As apparent from the above description, the semiconductor electrode is produced by forming a metal oxide layer, in which a phosphate is introduced, on a transparent electrode. The semiconductor electrode inhibits recombination reactions of electrons, facilitates migration of electrons, improves the dispersibility of a metal oxide and increases the amount of a dye adsorbed, thus achieving a remarkable improvement in power conversion efficiency. Therefore, the semiconductor electrode is useful in the fabrication of solar cells, e.g., dye-sensitized solar cells.

What is claimed is:

1. A semiconductor electrode, comprising:
   a transparent electrode consisting essentially of a substrate and a conductive material coated on the substrate; and
   a metal oxide layer formed on a surface of the transparent electrode, wherein the metal oxide layer contains a phosphate; and wherein the metal oxide layer is formed using a paste composition comprising a metal oxide, a solution of a binder in a solvent and a phosphate group-containing compound selected from the group consisting of the following Formulae 1 to 3:

(1)

wherein R is $C_1$-$C_{30}$ linear or branched alkyl, and
k is an integer from 1 to 20;

(2)

wherein X is an oxyethyl methacryloyl, oxyethyl acryloyl, polyoxypropyl methacryloyl or polyoxyethyl methacryloyl group, and
l is an integer from 1 to 20; and (3)

wherein $R_1$, $R_2$ and $R_3$ are independently OH, ONa or $C_1$-$C_{30}$ linear or branched alkyl, provided that at least one of $R_1$, $R_2$ and $R_3$ is $C_1$-$C_{30}$ linear or branched alkyl.

2. The semiconductor electrode according to claim 1, wherein the phosphate is in a $PO_2$ or $PO_3$ form.

3. The semiconductor electrode according to claim 1, wherein one of the compounds of Formulae 1 to 3 is represented by one of the following Formulae 4 to 7:

(4)

wherein m is an integer from 1 to 20;

(5)

wherein n is an integer from 1 to 20;

(6)

and (7)

4. The semiconductor electrode according to claim 3, wherein the compound of Formula 4 or 5 is represented by one of the following Formulae 8 through 11:

(8)

(9)

(10)

and (11)

5. The semiconductor electrode according to claim 1, wherein the metal oxide is at least one oxide selected from the group consisting of titanium oxide, niobium oxide, hafnium oxide, indium oxide, tungsten oxide, tin oxide, and zinc oxide.

6. The semiconductor electrode according to claim 1, wherein the metal oxide is a nanomaterial comprising quantum dots, nanodots, nanotubes, nanowires, nanobelts, or nanoparticles.

7. The semiconductor electrode according to claim 1, wherein the solvent is selected from the group consisting of aqueous solvents, organic solvents, and mixtures thereof.

8. The semiconductor electrode according to claim 7, wherein the solvent is selected from: aromatic hydrocarbon compounds, including toluene and xylene; ether compounds, including tetrahydro furan and 1,2-butoxyethane; ketone compounds, including acetone and methyl ethyl ketone; ester compounds, including ethyl acetate, butyl acetate, butyl carbitol acetate (BCA) and propylene glycol monomethyl ether acetate; alcohol compounds, including isopropyl alcohol, diethylene glycol monobutyl ether, terpineol and 2-phenoxyethanol; water; and mixtures thereof.

9. The semiconductor electrode according to claim 1, wherein the binder is selected from the group consisting of aqueous binders, organic binders, and mixtures thereof.

10. The semiconductor electrode according to claim 9, wherein the binder is at least one binder selected from the group consisting of acrylic polymers, styrenic polymers, cellulosic polymers, methacrylate polymers, styrene-acrylate copolymers, polystyrene, polyvinyl butyral, polyvinyl alcohol, polyethylene oxide, polypropylene carbonate, polymethylmethacrylate, ammonium acrylate, gum arabic, and gelatin.

11. The semiconductor electrode according to claim 1, wherein the paste composition comprises 10 to 40% by weight of the metal oxide, 1 to 10% by weight of the phosphate group-containing compound with respect to the weight of the metal oxide powder, and the balance of the binder solution.

12. The semiconductor electrode according to claim 1, further comprising a dye formed on top of the metal oxide layer.

13. A dye-sensitized solar cell, comprising:
the semiconductor electrode according to claim 1;
an electrolyte layer; and
a counter electrode.

14. A dye-sensitized solar cell, comprising:
a semiconductor electrode, comprising:
a transparent electrode consisting essentially of a substrate and a conductive material coated on the substrate; and
a metal oxide layer formed on a surface of the transparent electrode wherein the metal oxide layer contains a phosphate;
an electrolyte layer; and
a counter electrode,
wherein the metal oxide layer is formed using a paste composition comprising a metal oxide, a solution of a binder in a solvent and a phosphate group-containing compound selected from the group consisting of compounds of the following Formulae 1 to 3:

(1)

wherein R is $C_1$-$C_{30}$ linear or branched alkyl, and k is an integer from 1 to 20;

(2)

wherein X is an oxyethyl methacryloyl, oxyethyl acryloyl, polyoxypropyl methacryloyl or polyoxyethyl methacryloyl group, and l is an integer from 1 to 20; and (3)

wherein $R_1$, $R_2$ and $R_3$ are independently OH, ONa or $C_1$-$C_{30}$ linear or branched alkyl, provided that at least one of $R_1$, $R_2$ and $R_3$ is $C_1$-$C_{30}$ linear or branched alkyl; and wherein the phosphate in the metal oxide layer is in a $PO_2$ or $PO_3$ form.

* * * * *